United States Patent [19]

Hayashi

[11] 4,077,044

[45] Feb. 28, 1978

[54] NONVOLATILE MEMORY SEMICONDUCTOR DEVICE

[75] Inventor: Yutaka Hayashi, Hoya, Japan

[73] Assignee: Agency of Industrial Science & Technology, Tokyo, Japan

[21] Appl. No.: 608,676

[22] Filed: Aug. 28, 1975

[30] Foreign Application Priority Data

Aug. 29, 1974 Japan .................................. 49-98418

[51] Int. Cl.$^2$ .......................................... H01L 29/78
[52] U.S. Cl. ..................................... 357/23; 357/30; 357/41; 357/54; 357/59; 307/238
[58] Field of Search ....................... 357/23, 41, 59, 30, 357/54; 307/238

[56] References Cited

U.S. PATENT DOCUMENTS

| | | | |
|---|---|---|---|
| 3,657,614 | 4/1972 | Cricchi | 357/23 |
| 3,714,522 | 1/1973 | Komiya et al. | 357/23 |
| 3,728,695 | 4/1973 | Frohman-Bentchkowsky | 357/23 |
| 3,745,426 | 7/1973 | Olmstead | 357/23 |
| 3,755,721 | 8/1973 | Frohman-Bentchkowsky | 357/23 |
| 3,774,087 | 11/1973 | Pepper | 357/23 |
| 3,825,945 | 7/1974 | Masuoka | 357/23 |
| 3,825,946 | 7/1974 | Frohman-Bentchkowsky | 357/54 |
| 3,829,881 | 8/1974 | Kohashi | 357/23 |
| 3,906,296 | 9/1975 | Maserjian et al. | 357/23 |
| 3,916,430 | 10/1975 | Heuner et al. | 357/41 |

OTHER PUBLICATIONS

Electronics–"Electronics International–Japan," Oct. 26, 1970.
F. Hochberg, "FET Gate Structure," IBM Tech. Discl. Bull., vol. 8, No. 5, Oct. 1965, p. 813.
B. Agusta et al., "Nonvolatile Imaging Devices," IBM Tech. Discl. Bull., vol. 15, No. 9, Feb. 1973, p. 2821.
J. Elliott et al., "Self-Limiting Off-Chip Driver," IBM Tech. Discl. Bull., vol. 16, No. 8, Jan. 1974, pp. 2679-2680.
C. Hu et al., "A Resistive-Gated IGFET Tetrope," IEEE Trans, On Elec. Dev., vol. Ed-18, No. 7, Jul. 1971, pp. 418-425.
A. Tickle et al., "Electrically Alterable Non-Volatile Semiconductor Memory Tech., " 1972 Wescon Tech. Papers, vol. 16, Sep. 19-22, 1972, pp. 1-8.

Primary Examiner—Stanley D. Miller, Jr.
Assistant Examiner—Joseph E. Clawson, Jr.
Attorney, Agent, or Firm—Oblon, Fisher, Spivak, McClelland & Maier

[57] ABSTRACT

Disclosed is a field-effect transistor device which is capable of storing pieces of analogue information in the form of charge stored in a charge-storing means. A memory device according to this invention comprises, drain and source regions in a semi-conductor substrate, an insulating layer lying on the major surface of the substrate and an elongated resistive gate region lying on the insulating layer between the drain and source regions and having two electrodes provided on the opposite ends of the gate region. When a voltage below the critical voltage of charge injection is applied to one of the electrodes whereas a voltage above the critical voltage and representative of analogue information is applied to the other electrode, the area of charge injection in the charge-storing mechanism of the insulating layer varies with the latter "writing" voltage, thus realizing the storage of analogue information if said area is filled with electric charge. The piece of analogue information thus stored is read in terms of source-to-drain current.

14 Claims, 17 Drawing Figures

NONVOLATILE MEMORY SEMICONDUCTOR DEVICE

BACKGROUND OF THE INVENTION

This invention relates generally to a semiconductor device, and more particularly to a nonvolatile memory semiconductor device which is capable of storing pieces of analogue information in an exact and nonvolatile way.

In an insulated gate type field-effect transistor having an electric charge-storing means in the insulating layer, a gate threshold voltage of the transistor depends on the polarity and amount of electric charge which is stored in the electric charge-storing mechanism, and therefore the piece of information stored in the form of electric charge can be read in terms of source-to-drain current (or source-to-drain resistance) at a constant gate bias voltage. As a way for storing pieces of analogue information, there can be considered the method of continuously changing the threshold voltage by raising the gate bias voltage within the range of several volts above a given constant value. For performing this, the amount of carrier (electric charge) injected to the electric chargestoring mechanism is continuously controlled.

However, the electric charge stored in the electric charge-storing mechanism bleeds out with time, and therefore if the same amount of electric charge bleeds out, irrespective of the amount of stored electric charge, and if the difference is small between the gate threshold voltage and the gate bias voltage at the time of reading, the "setting" error becomes large, compared with the instance in which the difference is large between the gate threshold voltage and the gate bias voltage at the time of reading, and thus pieces of information are not well stored.

SUMMARY OF THE INVENTION

This invention was made for avoiding these defects, and therefore the object of this invention is to provide a nonvolatile memory semiconductor device which is capable of storing pieces of analogue information in an exact and nonvolatile way. To attain this and other objects there is provided a semiconductor memory element comprising a drain region, a source region in a semiconductor substrate, an insulating layer on the major surface of the substrate, said insulating layer including an electric charge storing mechanism therein and an elongated resistive gate lying on the insulating layer and having at least two electrodes. With this arrangement, if a voltage below the critical voltage of charge injection is applied to one of the electrodees, and if a voltage above the critical voltage, changed in connection with a piece of analogue information is applied to the other electrode, the area of charge injection in the electric charge-storing means varies with the latter "writing" voltage. Thus, the piece of analogue information is stored in the form of the area of the electric charge-storing means is filled with electric charge. The so stored piece of information is read in terms of source-to-drain current.

BRIEF DESCRIPTION OF THE DRAWINGS

This invention will be better understood from the following description which is made with reference to the accompanying drawings:

FIG. 1 shows a conventional memory device, an improvement of which this invention relates to.

DESCRIPTION OF THE PREFERRED EMBODIMENTS

Figure 1:
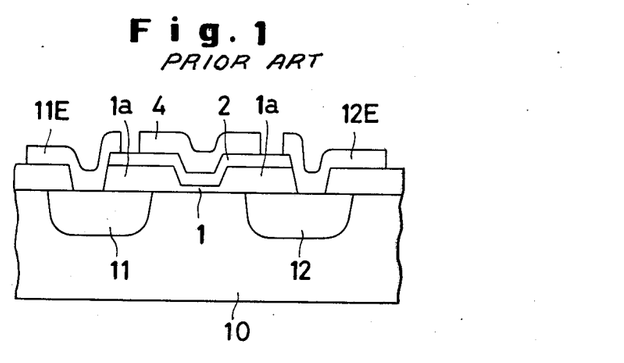

Before going into an explanation of the principle according to which a nonvolatile memory element of this invention operates, a special type field-effect transistor which is generally called an "insulated gate type field-effect transistor having an electric charge-storing means in the gate insulating layer" is described for the sake of making the present invention easier to understand. Referring to FIG. 1, there is shown a double insulating layer type field-effect transistor. In a semiconductor substrate 10 there are a drain region 11 and a source region 12. A double-laminated insulating layer 1 and 2 are laid on the upper major surface of the semiconductor substrate 10, and a gate electrode 4 is laid on the insulating layer. The underlying insulating layer 1 is made of $SiO_2$. The thickness of the middle portion of the $SiO_2$ layer is thin enough to allow carriers to pass therethrough by the tunnelling effect. But the adjacent and the other portions 1a of the layer 1 are thick enough to prevent tunnelling effect. The overlying insulating layer 2 is made of silicon nitride, alumina and other proper material. The drain and source regions 11 and 12 have electrodes 11E and 12E electrically connected thereto respectively.

Figure 2:
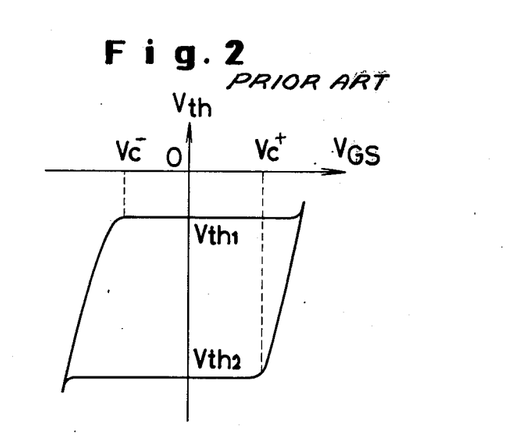
FIG. 2 is a graph which is used in describing the operation of the conventional memory device.

Assuming that the conductivity type of the semiconductor substrate 10 is "N", the device of FIG. 1 operates as shown in FIG. 2.

First, assume that the device is in the state of Vth (gate threshold voltage) = $Vth_2$. If the gate-source voltage $V_{GS}$ rises above a given critical value $V_c^+$, electrons will pass through the thin portion of the underlying $SiO_2$ layer 1 by the tunnelling effect, and then those electrons will be stored in the trap existing at the interface between the underlying $SiO_2$ layer 1 and the overlying silicon nitride layer 2. As a result the gate threshold voltage Vth increases in the positive direction. Specifically, if the gate-source voltage $V_{GS}$ is raised fro $V_c^+$ to $V_c^+ + \Delta V_+$ in the positive direction, the gate threshold voltage Vth rises to $Vth_1$. Even if the voltage $V_{GS}$ is still increased, other relatively stable states of threshold voltage will not appear. If the voltage $V_{GS}$ is changed in the opposite direction, that is, toward zero bias, the gate threshold voltage still remains at $Vth_1$.

The voltage $V_{GS}$ is increased in the negative direction until it reaches $V_c^- - \Delta V_-$, and then the gate threshold voltage Vth descends to $Vth_2$. Once this situation has been reached, the threshold voltage Vth remains at $Vth_2$ even if the voltage $V_{GS}$ is reversedly increased to zero bias. Now assuming that the situation, $Vth = Vth_1$ is made to correspond to the binary "1" and that the situation, $Vth = Vth_2$ is made to correspond to the binary "0", the semiconductor device will function as a digital memory. No stable state of threshold voltage will appear in the transient area from $Vth = Vth_1$ to $Vth = Vth_2$ or vice versa, and therefore the conventional device cannot function as an analogue memory device. In contrast to the digital-storing function of the conventional device, a memory device according to this invention is responsive to a "writing" voltage for changing the potential distribution in the two-dimensional extension of the electric charge-storing means in such a way that the area of charge injection in the electric chargestoring means is accordingly varied, thus realizing the storage of analogue information when the area of charge injection thus controlled is filled with electric charge. In this case a relatively large amount of electric charge can be stored per unit area, and accordingly the threshold voltage and the gate bias voltage at the time of "reading" are so far from each other that pieces of information can be stored in an exact and nonvolatile way. Taking an example of the "reading-out" of information in terms of electric current, the drain-source current $I_{DS}$ is given by:

$$I_{DS} = \beta/2(V_{GS} - Vth)^2$$

As is readily understood from this equation, it is necessary that: $\beta$ or $(V_{GS} - Vth)$ be varied with information to be stored, and the so varied parameter be retained in nonvolatile way until the information is "read-out" in terms of $I_{DS}$. The method of changing $(V_{GS} - Vth)$ in response to piece of information has been hitherto used, and this method, as mentioned earlier, does not assure nonvolatile storage of information because of the inherent small difference of $(V_{GS} - Vth)$ and the unstableness of Vth. In contrast to this, according to this invention the area of charge injection in the electric charge storing means is varied with a piece of analogous information. This corresponds to variation of "$\beta$".

As is apparent from the above, one object of this invention is to provide a semiconductor memory device comprising a drain region and a source region built in a semi-conductor substrate, an insulating layer overlying the substrate and including an electric charge-storing means, and an elongated resistive gate region overlying the insulating layer and having at least two electrodes whereby the potential gradient across the space between the two electrodes of the elongated resistive gate region varies in response to a "writing" voltage to one of the two gate electrodes while the other electrode remains at a given constant voltage in the opposite relation with the "writing" voltage with reference to the critical voltage, thus controlling the area of charge injection in the electric charge storing means.

The piece of analogue information will be stored when the so-controlled area of charge injection is filled with electric charge, and the so-stored analogue information can be read in terms of source-to-drain current or resistance. Now referring to FIGS. 3 to 7, some embodiments of this invention are described as follows.

Figure 3:
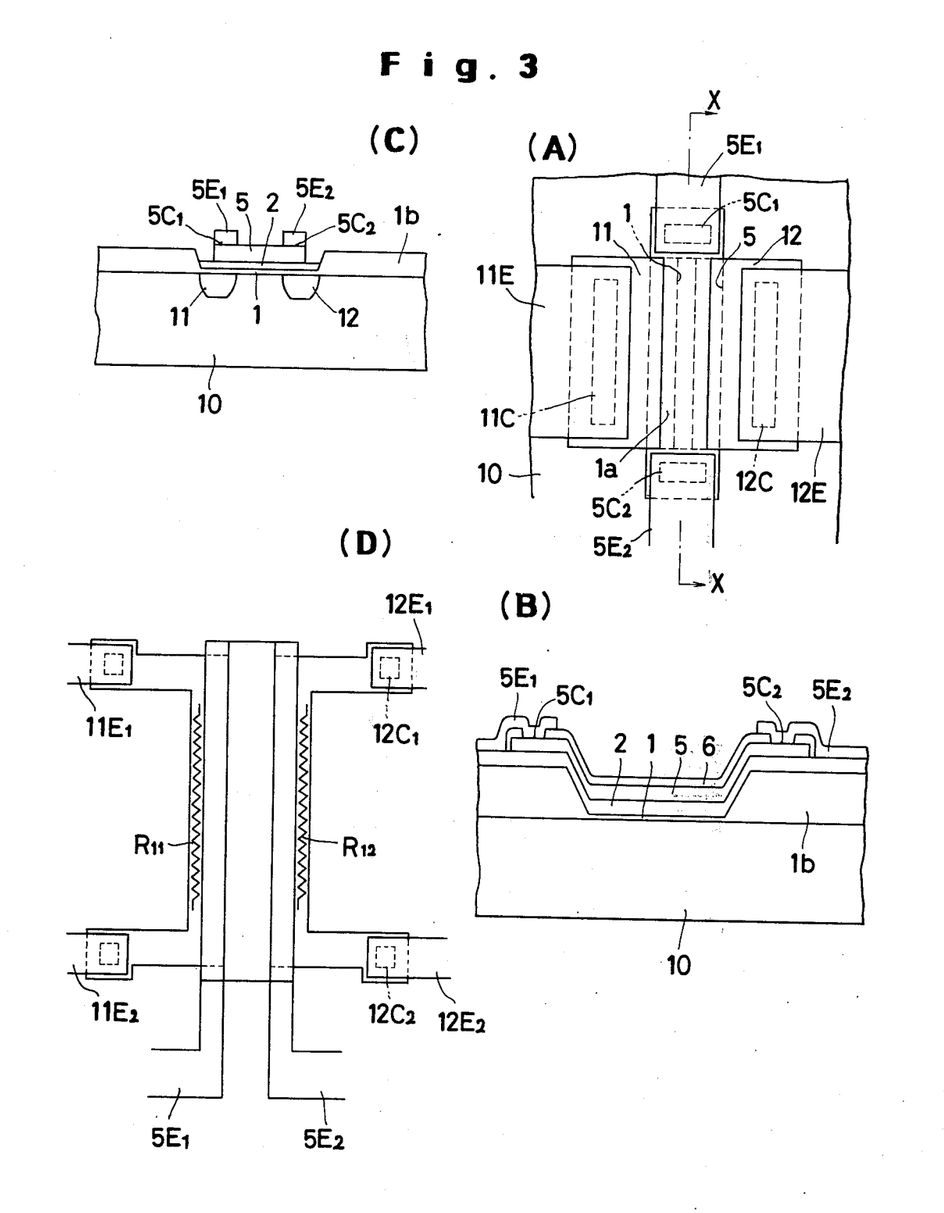
FIGS. 3(A) to 3(D) show the first embodiment according to this invention.
Figure 4:
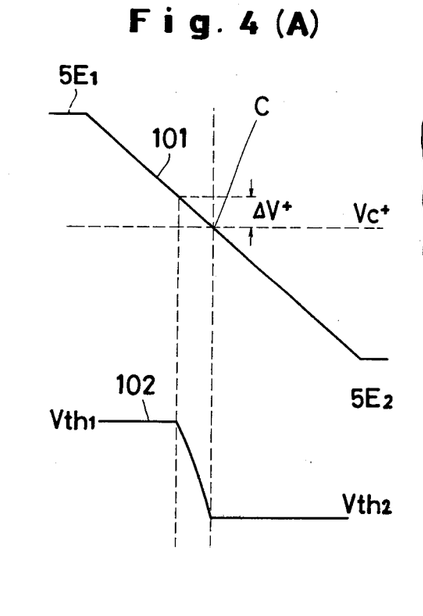
FIGS. 4(A) and 4(B) are graphs which are used in describing the operation of the first embodiment.

FIG. 3 shows the first embodiment according to this invention. As is shown in FIG. 3(A), a semicondutor substrate 10 includes a drain region 11 and a source region 12. An electrode 11E is connected to the drain region 11 by associated contact 11C whereas an electrode 12E is connected to the source region 12 by associated contact 12C. A double-laminated insulating layer 1, 2 is laid on the substrate 10, as is the case in FIG. 1.

According to this invention an elongated resistive gate region 5 is laid on the insulating layer 1,2 as a means to change the area of charge injection in the electri charge-storing means in reply to a voltage representing a piece of analogue information.

The elongated gate region is of a resistive material, such as for instance a semicondcutor film or a resistive film.

FIG. 3(B) shows a cross-section of the semiconductor device taken along the line X - X' in FIG. 3(A).

The electrodes $5E_1$ and $5E_2$ are connected to the opposite ends of the elongated gate region 5 through the contact holes $5C_1$ and $5C_2$ respectively. The parts 1b of the underlying insulating layer just under the electrodes $5E_1$ and $5E_2$ are still thicker than the parts 1a of the underlying insulating layer 1 in FIG. 1, thus preventing a channel from being induced the surface area of the substrate 10 lying under the part 1b of the underlying insulating layer. Because otherwise, a channel would be induced as a result of application of a voltage between the resistive gate region and the substrate. An uppermost insulating layer 6 covers the resistive gate region for the purpose of protection.

Now, the driving and function of the first embodiment are described.

Assuming that a voltage which is far from $V_c^-$ in the negative direction, is applied to the resistive gate region, the state of gate threshold voltage $Vth = Vth_2$ prevails over the whole area of the channel between the source and drain regions.

Assuming that a voltage which is far from $V_c^+$ in the positive direction, is applied to the electrode $5E_1$ and that a voltage which is far from $V_c^+$ in the negative direction, is applied to the electrode $5E_2$, the potential distribution across the length of the gate region 5 between the electrodes $5E_1$ and $5E_2$ is of a linear form as such shown by 101 in FIG. 4(A). The threshold voltage accordingly varies as shown in the curve 102 of FIG. 4(A). Specifically, at the right side ($5E_2$) with regard to point "C" at which the gate voltage corresponds to $V_c^+$, the threshold voltage remains at a constant value $Vth_2$, whereas at the left side ($5E_1$) the threshold voltage Vth rises from $Vth_2$ to $Vth_1$ in the areas ranging from point "C" to that which corresponds to $V_c^+ + \Delta V_+$ on the line 101, and finally the threshold voltage reaches a constant value $Vth_1$ at the left side of $V_c^+ + \Delta V_+$ point.

The "writing" can be performed as described above.

As for the "reading", a "reading" voltage intermediate between $Vth_1$ and $Vth_2$ is applied to the electrodes $5E_1$ or $5E_2$. As a result an electric current flows in the area of the channel in which Vth is equal to $Vth_1$ whereas substantially no electric current flows in the remaining area of the channel. The area of the channel in which Vth is equal to $Vth_1$ will be enlarged with the increase of "writing" voltage, for same "reading" voltage. Therefore, the value of the source-to-drain current will vary with the area of the channel for $Vth = Vth_1$ in a continuous or analogue way. Either the voltage of the electrode $5E_1$ or $5E_2$ can be used as the "writing" voltage.

Referring to FIG. 4(B), an alternative mode of "writing" is described as follows.

Assuming that the "writing" is completed in the manner as described above with reference to FIG. 4(A), the potential at the electrode $5E_1$ is decreased below $V_c^-$, and the "writing" is performed in the state of a channel as indicated by th straight line 103. As shown by the straight line 104, the area of the channel in which the threshold voltage is $Vth_1$, appears in a desired channel part lying between the electrodes $5E_1$ and $5E_2$. Thus, the area of the channel for injection is controlled. Still alternatively, the whole channel part lying between the electrodes $5E_1$ and $5E_2$ is put in the state of $Vth_1$, and in the "writing", a potential lower than $V_c^-$ is applied to one of the electrodes $5E_1$ and $5E_2$ so as to put a selected area of the channel in the state of $Vth = Vth_2$.

In the embodiments heretofore described, the electrodes $5E_1$ and $5_2$ are positioned transversely with respect to the source-to-drain 12 direction. These electrodes, however, may be positioned in the source-to-drain direction as shown as FIGS. 3(C) and 3(D). In this case it is necessary that the "reading" gate voltage be selected as negative with respect to $Vth_2$ for a "P" type channel and in positive with respect to $Vth_1$ for an "N" type channel.

In the case where $Vth_2$ is positive for the "P" type channel and in the case where $Vth_1$ is negative for the "N" type channel, carriers are induced locally in the channel-forming region even if the gate-source voltage is zero, thus permitting an electric current to flow between the drain and source regions. Therefore, without a complicated gate-bias circuit, a resistance of good linearity and stable value can be provided by connecting to the source region the gate electrode existing at the side of source and by connecting to the drain region the gate electrode existing at the side of drain.

Specifically, a voltage in the vicinity of the drain voltage is applied to the gate electrode at the drain side, and a voltage in the vicinity of the source voltage is applied to the gate electrode at the source side. Thus, the potential distribution in the drain-to-source direction in the channel is substantially the same as the potential distribution in the drain-to-source direction in the gate region. Therefore, the charge distribution in the channel becomes even in the drain-to-source direction with the result that a resistance of good linearity appears in the drain-to-source direction. In this case, if the same "writing" voltage is applied to both of the electrodes, the linearity of resistance is substantially improved.

In performing the "writing" while applying the same voltage to both of the gate electrodes, the threshold voltage in the whole channel area is retained at $Vth_1$, and then a voltage lower than $V_c^-$ is aplied to the gate electrode and a voltage difference according to an information to be stored is applied between the electrodes $11E_1$ and $11E_2$ and between $12E_1$ and $12E_2$ of the source and drain regions, each being of a relatively high resistance $R_{11}$ or $R_{12}$ as shown in FIG. 3(D), thus providing a potential gradient in a direction transverse to the electric current path in the channel-forming region so that the gate threshold voltage in a selected part of the channel-forming region where voltage between the gate and the source more negative than $V_c^-$ in the value change to $Vth_2$ whereas the gate threshold voltage in the remaining part remains in $Vth_1$. In case where only one electrode is provided to each of the source and drain regions, the change of the threshold voltage is written evenly to the direction along the source or drain region in the channel-forming region, but still available is the advantage that a resistivity of good linearity and stable value is obtained without a complicated gate-bias circuit.

Figure 5:
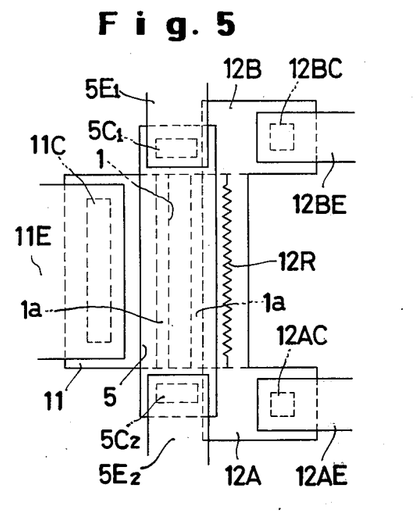
FIG. 5 shows the second embodiment according to this invention.
Figure 6:
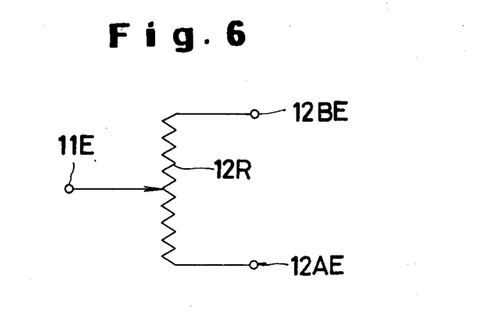
FIG. 6 shows an equivalent circuit of the second embodiment.

FIG. 5 shows the second embodiment according to this invention. In this drawing the same refernce numerals as used in FIG. 3 are used to indicate the same parts of the device.

An elongated region 12R of high resistance lies on at least one of the opposite and facing sides of the source and drain regions 11 and 12. This elongated resistance region 12R lies in parallel with the opposite and facing side of the source or drain region. Extended regions 12A and 12B of low resistance are integrally connected to the opposite ends of the elongated region 12R of high resistance. Contacts 12AC and 12BC are provided to the low-resistance regions 12A and 12B respectively. Electrodes 12AE and 12BE are provided to the contacts 12AC and 12BC respectively.

With this arrangement the elongated high-resistance region 12R is electrically connected to the source region 11 through the part of the channel lying under the resistive gate electrode 5. Thus, if a "writing" voltage to be applied to the electrodes $5E_1$ and $5E_2$ is varied, the resistance appearing between the electrodes 11E and 12AE (or 12BE) varies as in a potentiometer equivalently shown in FIG. 6. A variable fraction of the voltage between the electrodes 12AE and 12BE appears at the electrode 11E, and can be derived therefrom. One of the low-resistance regions 12A and 12B may be dispensed with. Also this embodiment may be modified by extending the elongated high-resistance region in place of the low-resistance regions 12A and 12B and by providing the electrodes 12AE and 12BE on the so extended parts of the elongated high-resistance region 12R.

Figure 7A:
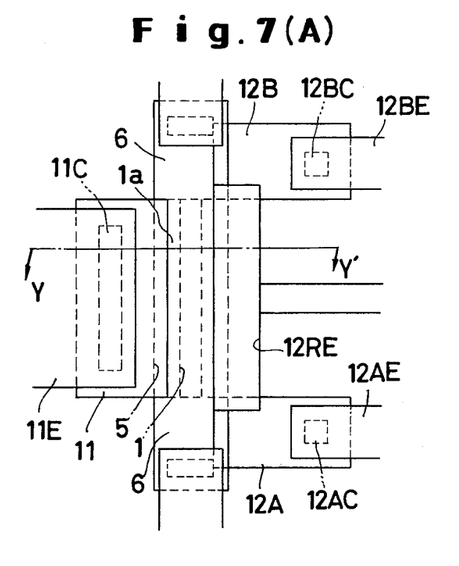
FIGS. 7(A) and 7(B) show the third embodiment according to this invention.
Figure 7B:
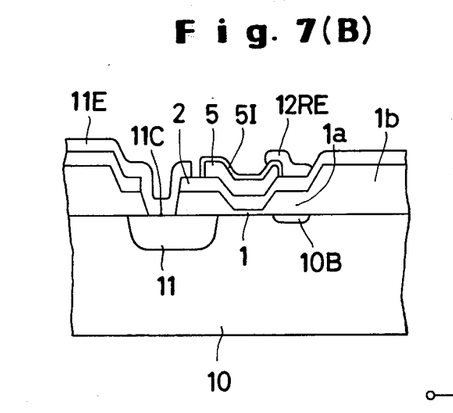

FIG. 7 shows the third embodiment according to this invention. In this drawing the same reference numerals as in FIG. 5 are used to indicate same parts of the device. FIG. 7(B) shows a cross-section of the device taken along the line Y – Y' of FIG. 7(A).

An inversion layer region 10B (FIG. 7(B)) is built in at least one of the opposite and facing sides of the source and drain regions 11 and 12. This inversion layer region 10B has an electrode 12RE provided on the combination of insulating layers 1a and 2. It is necessary that the gate electrode 12RE lie on the combination of insulating layer 5I and resistive gate 5. If it is not desired to vary the resistance of the inversion layer region 10B independently, the resistive gate 5 may be extended to occupy the place where the electrode 12RE lies. In this case one or two drain regions are provided to the place the drain regions do not face the source region, and the drain regions partly lies under the resistive gate 5.

As seen from the above, according to this invention there is provided a nonvolatile memory element of a semiconductor material which is capable of storing pieces of analogue information in an exact and nonvolatile way, and has resistive characteristics of good linearity.

The embodiments above described have a "P" type channel, but they can have an "N" type channel. This invention is described as being applied to a semiconductor element having a double insulating layer type charge storing mechanism.

This invention, however, is equally applicable to a floating gate type semiconductor element having a floating conductive or semiconductor piece in the gate insulating layer. The carrier injection may be performed by the tunnelling effect, avalanche breakdown effect, light exciting, or ultraviolet ray effect.

If the semiconductor device does not use the tunnelling effect, it is unnecessary to reduce the thickness of the insulating layer 1 lying on the surface of the semiconductor substrate 10. This invention may be equally applied to a device having an insulating layer of dielectric polarizing property.

As was described with the above embodiments of FIGS. 3(C), 3(D), 5 and 7, it is one of the objects of this invention to obtain a device in which an analogue value of resistance is memorized and can be read with good linearity over a wide range of voltage applied across the output terminal, without complicated gate bias circuitry. This object is realized also by a floating gate field-effect transistor with two gate electrodes on or two low resistive regions in the floating resistive gate. The low resistive regions in the floating gate act in the "read-out" phase with the same function as the two electrodes $5E_1$, $5E_2$ in FIGS. 3(C) and 3(D). The structure and operation of the device will become more clear by the following description and drawings.

According to another aspect of this invention there is provided a nonvolatile variable resistance device which essentially comprises a source region, a drain region, a channel-forming region defined by the source region and the drain region and a floating gate region embedded in a gate insulating layer, said floating gate composed of a central high-resistance part lying over the channel-forming region and two parallel and opposite low-resistance parts lying over the source and drain regions respectively.

Figure 8:
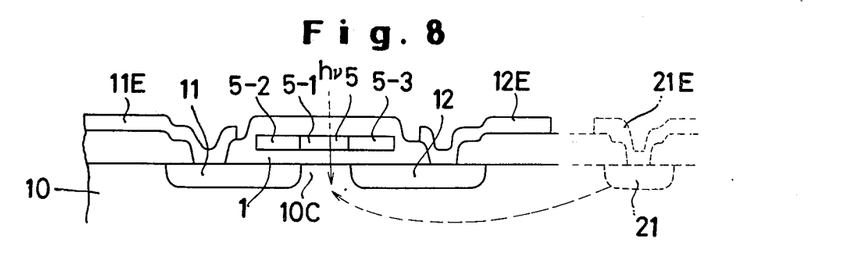
FIG. 8 shows, in section, a nonvolatile variable resistance device according to this invention.

Referring to FIG. 8, there is shown, in section, a nonvolatile variable resistance device according to this invention. A source region 11 (or 12) and a drain region 12 (or 11) are separated from each other and built in the major surface of a semiconductor substrate. A channel-forming region 10C lies between the source and drain regions. A gate insulating layer 1 extends to cover the channel-forming region 10C and the parts of the source and drain regions facing the channel-forming region. A floating gate 5 of a semiconductor or electric resistive material is embedded in the gate insulating layer 1. This floating gate is consisted of a high-resistance region 5-1 and two low-resistance regions 5-2 and 5-3 lying along the opposite longitudinal sides of the high-resistance region.

Electric charge can be injected in the floating gate according to different methods as mentioned later. Assume that the electric charge is injected in the floating gate according to one of such methods, and that the polarity of the electric charge stored in the floating gate is opposite to that of the induced carrier charge of the channel so as to induce a channel in the channel-forming region. When an AC signal voltage is applied between the source and drain regions, the AC signal voltage will appear across the high-resistance region 5-1 through a capacitance "$C_2$" between the source region 11 and the overlying low-resistance region 5-2 and through a capacitance "$C_3$" between the drain region 12 and the overlying low-resistance region 5-3. If the frequency of the AC signal is large, compared with the critical frequency $f_c = (C_2 + C_3)/2\pi C_2 C_3 R$ ($R$: resistance of the high-resistance region 5-1 measured between the regions 5-2 and 5-3), the AC voltage appearing across the high-resistance region is almost equal to the AC voltage applied between the source and drain regions, and the amount of electric charge induced in the part of the channel in the vicinity of the source region and the amount of electric charge induced in the part of the channel in the vicinity of the drain region remain continuously constant, irrespective of the value of the voltage between the drain and source regions. Stated otherwise, there is no current saturation such as is ordinarily observed in a field-effect transistor, and thus a resistance of good linearity results between the source and drain regions. This resistance varies inversely with the electric charge of the channel, and therefore if the amount of electric charge injected to the floating gate is varied, the device will function as a nonvolatile variable resistor.

As mentioned above, a field-effect transistor according to this invention which comprises a source region, a drain region, a channel-forming region and an insulated floating gate having a high-resistance region lying over the channel forming region and two low-resistance regions lying over the source and drain regions functions as a nonvolatile variable resistor, i.e. as a nonvolatile memory device.

The high-resistance part of the floating gate may be made for instance, of a polycrystalline silicon film which has not been doped with impurities. The high-resistance part of the floating gate thus made is at $10^{10}$ or more ohms. The capacitances "$C_2$" and "$C_3$" can be, in fact, as small as 1 picofarad. Therefore, the critical frequency "$f_c$" can be as low as one hertz. Thus, the variable resistance element according to this invention can be used for audio and higher frequencies. The floating gate may be made of $SnO_2$ and other semiconductor and resistive materials. The low-resistance regions 5-2 and 5-3 of the floating gate can be made by selecting doping of corresponding parts of a semiconductor floating gate with impurities such as donors or acceptors. Otherwise, they may be made by depositing metal films on corresponding parts of the floating gate material.

Now, the "writing" or electric charge injecting method is described.

In FIG. 8, when an avalanche-yield voltage is applied between the low resistance drain region 12 and the channel-forming region 10C, carriers will be produced by avalanche-breakdown effect, and some of these carriers which are opposite to the polarity of the carriers of the channel, will be subjected to the influence of the electric field appearing between the drain region 12 and the floating gate 5 as a result of the applied voltage, thus causing the carriers of opposite polarity to ride over the barrier between the semiconductor and the insulating coating and to invade the floating gate. Thus, the gate is loaded with electric charge of the opposite polarity to the carriers of the channel. As a result of the injection of the carriers of the opposite polarity into the floating gate, new carriers will be induced additionally in the channel, and thus the total number of the carriers of the channel will increase with the result that the resistance between the source and drain regions accordingly decreases. As is apparent from the above, a "writing" voltage representing a piece of analogue information over the avalanche breakdown voltage is applied between the drain region 12 and the channel-forming region 10C, and then, the piece of analogue information is stored in terms of resistance, and the so-stored information can be read in terms of current or resistance.

Figure 9:
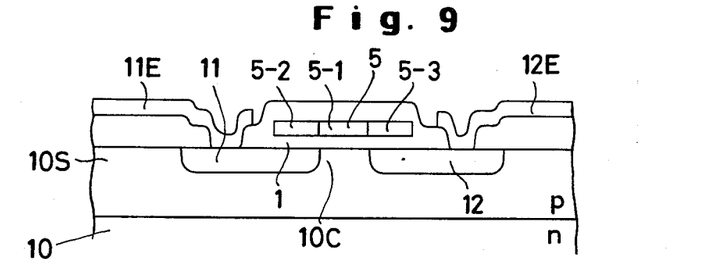
FIG. 9 shows, in section, another embodiment of nonvolatile variable resistance according to this invention.

Referring to FIG. 9, there is shown another embodiment according to this invention. The "writing" can be performed in a similar way. The "erasing" is described in connection with the structure of this particular embodiment. As shown in the drawing, on a semiconductor substrate 10 of one conductivity type (n) there is a semiconductor plate 10S of the other conductivity type (P), and a source region 11 and a drain region 12 are formed in the semiconductor plate 10S. A channel-forming region 10C lies between the source and drain regions. In the operation of "erasing", a reverse bias voltage is applied between the source region 11 and the channel-forming region 10C and between the drain region 12 and the channel-forming region 10C respectively, and at the same time a forward bias voltage is applied between the semiconductor substrate 10 and the semiconductor plate 10S to inject minority carriers from the semiconductor substrate 10 to the semiconductor plate 10S. The minority carriers thus injected will diffuse and reach the channel-forming region 10C, and then these minority carriers will be accelerated and driven into the gate insulating layer 1 under the influence of the surface electric field, which is caused by the reverse bias voltage between the channel and the channel forming region. Thus, the floating gate is loaded with electric charge of the same polarity as the carriers of the channel. In this case the carriers of the channel decrease, and therefore the resistance between the source and drain regions rises accordingly. If a large amount of minority carriers are injected from the semiconductor substrate 10 to the semiconductor plate 10S, the path between the source and drain regions will be put in the non-conductive state.

As for the structure of the device as shown in FIG. 8, it can be modified to permit the "erasing" operation by providing a region 21 for injection of minority carriers to constitute a "p-n" junction in the semiconductor substrate 10 within a proper range from the floating gate several times as much as the diffusion distance. Alternatively, the device of FIG. 8 may be modified by using, in place of a relatively thick floating gate, a slitted floating gate or a floating gate which is thin enough to allow photons hv to pass therethrough. As for the former modification which has an additional "p-n" junction for injection of minority carriers, the floating gate may be extended to the vicinity of the "p-n" junction, thus enhancing the effect of injection of minority carriers to the floating gate. In each of the structures showing FIGS. 8 and 9, different ohmic-contact electrodes are provided to the semiconductor substrate 10, the semiconductor plate 10S, the source region 11, the drain region 12 and the region 11. In these drawings, only the source electrode 11E, the drain electrode 12E and the electrode 11E of the region 11 are shown. As a matter of course necessary conductors, although not shown, are connected from all the electrodes to associated exterior terminals, and if the device is built in an IC substrate, necessary conductors are connected to the adjacent devices. However, no external conductor is connected to the floating gate 5, and once electric charge has been injected, the state of electric charge loading remains unchanged even if the "writing" voltage is removed from the device. The same resistance between the source and drain regions will appear if the same bias voltage is applied, and will be retained before a new injection of charge takes place.

Figure 10:
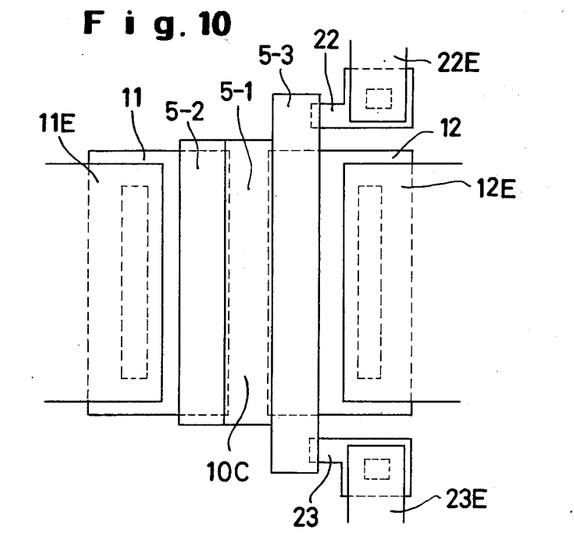
FIG. 10 shows, in plane, still another embodiment of nonvolatile variable resistance according to this invention.

Referring to FIG. 10, there is shown, in plan view, still another embodiment according to this invention. As shown, the low resistance region of the floating gate is extended in the longitudinal direction, and is coated with an insulating material. Two regions 22 and 23 lie under the opposite ends of the insulated floating gate. Each of these regions makes a rectifying junction with the semiconductor plate. With this arrangement the resistance varies in response to the "writing" voltage between the source and drain regions. This structure permits application of the avalanche breakdown voltage between the injection region 22 and the semiconductor substrate while an AC signal is applied between the source and drain regions, so that the carrier of the opposite polarity to the electric charge of the channel is injected to the floating gate.

An insulating layer must lie between the low resistance part 5-3 (or 5-2) of the floating gate and the underlying injection region 22. With this arrangement the breakdown voltage when applied to the injection region 22, will affect the potential of the floating gate via the existing capacitive coupling, thus presenting a resistance between the source and drain regions which is different from the predetermined postinjection resistance. In this connection a compensation region 23 is provided. As shown, a part of the compensation region is laid under the low resistance part of the floating gate at the end opposite to the end of the low resistance part to which the injection region 22 is provided, and an insulating layer is laid between the low resistance part 5-3 (or 5-2) of the floating gate and the underlying compensating region 23. At the time of injection the potential of the compensating region 23 is made to change in the opposite way to the potential change of the injection range. In FIG. 10, 22E and 23E are electrodes for the injection and compensation regions respectively.

Figure 11:
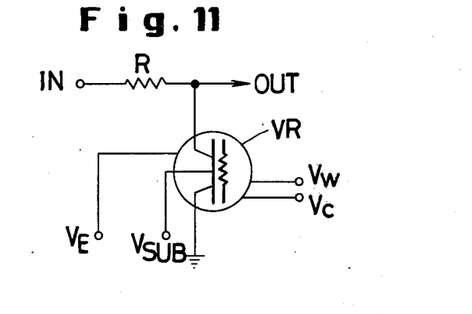
FIG. 11 and FIG. 12 show different manners in which a nonvolatile variable resistance device according to this invention is used.

FIGS. 11 and 12 show different manners in which a nonvolatile variable resistance element VR according to this invention is used. Referring to FIG. 11, the source (or drain) electrode of the variable resistance device is connected to one end of a resistance $R_1$. Thus, the other end of the resistance and the other drain (or source) electrode of the device are used for input terminals, whereas the joint between the resistance $R_1$ and the source (or drain) electrode and the drain (or source) electrode are used for output terminals. The total device functions as a contactless, variable attenuator. Different terminals labeled $V_w$, $V_c$, $V_E$ and $V_{SUB}$ are connected to the regions 12, 13, 11, and 10 of the device for instance, as shown in FIG. 10. The terminals other than that labeled $V_{SUB}$ are used for varying the value of resistance, and these terminals may be connected to a common bias voltage supply for ordinary use.

Figure 12:
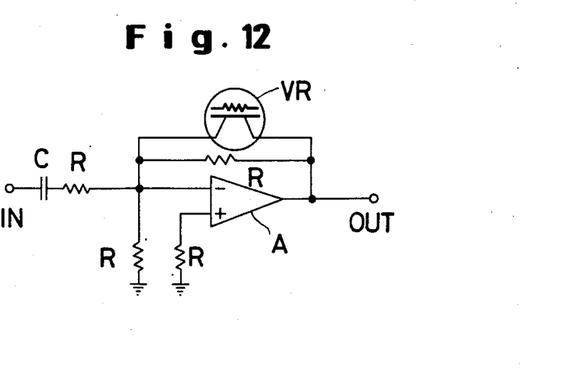

Referring to FIG. 12, the variable resistance element according to this invention is used as a feed-back resistance. In this particular use, once the gain of the total device has been set at a given value, it will be kept even if the bias voltages are removed, and also the gain may be varied when occaasion demands. "A" is a high-gain, differential amplifier, and "$R_1$", "$R_2$" and "$R_3$" are high resistances of the same order. The cut-off frequency of the total device is determined from $\frac{1}{2}\pi CR_4$ if this figure is larger than the critical frequency "$f_c$" mentioned earlier. Otherwise, the cut-off frequency is determined by "$f_c$".

As is apparent from the foregoing, each of the embodiments according to this invention in FIGS. 8, 9 and 10 essentially comprises a source region, a drain region, an a channel-forming region and a floating gate embedded in an insulating layer, said floating gate composed of a central high-resistance part lying above the channel-forming regions, and two opposite low-resistance parts lying above the source and drain regions respectively. With this arrangement the device functions as a contactless variable resistance or a nonvolatile memory device.

The explanation pertaining to one of the drain and source regions holds as well for the other region and in both regions. Each of the embodiments is shown and described as having a semiconductor substrate 10 for exclusive use. Memory elements according to the invention, however, can be built in an electrically isolated region in a semiconductor substrate or in a semiconductor film on an insulating substrate. In this case, the source and drain regions can make either ohmic contact with or rectifying junction with the electrically isolated region or the semiconductor film. The exclusive semiconductor substrate, electrically isolated semiconductor areas and thin semiconductor film on an insulating plate are generally called "semiconductor regions".

Obviously, numerous additional modifications and variations of the present invention are possible in light of the above teachings. It is therefore to be understod that within the scope of the appended claims, the invention may be practiced otherwise than as specifically described herein.

What is claimed as new and desired to be secured by Letters Patent in the United States is:

1. A nonvolatile semiconductor memory device with analogue information storage capability, comprising:
   a semiconductor substrate of a first conductivity type;
   at least two spaced apart regions in the substrate and of opposite conductivity type to the substrate, the regions defining a channel-forming region in the substrate;
   an insulating layer disposed on the substrate at least about the channel-forming region;
   charge-storing means disposed in the insulating layer and at least above the channel-forming region;
   a gate disposed on the insulating layer above the channel-forming region, the gate comprising an elongated resistive layer; and
   a first pair of electrodes, one of the electrodes contacting one side of the resistive layer for supplying a voltage varying according to analogue information to be stored in the device and the other electrode contacting the opposite side of the resistive layer.

2. The device as set forth in claim 1 wherein:
   the insulating layer is double-laminated; and the charge-storing means is disposed at the interface between the two laminae.

3. The device as set forth in claim 1, wherein:
   the charge-storing means is disposed in the insulating layer above a portion of the channel-forming region which is nonadjacent either of the two spaced apart regions.

4. The device as set forth in claim 1 including:
   a second pair of electrodes disposed in contact with one of the spaced apart regions, the one of the spaced apart regions exhibiting resistive characteristics between the second pair of electrodes.

5. A nonvolatile semiconductor memory device with analogue information storage capability, comprising:
   a semiconductor substrate of a first conductivity type;
   at least two spaced apart regions in the substrate and of opposite conductivity type to the substrate, the regions defining a channel-forming region in the substrate;
   an insulating layer disposed on the substrate at least above the channel-forming region;
   a charge-storing means disposed in the insulating layer and at least above the channel-forming region;
   a gate disposed on the insulating layer above the channel-forming region; and
   a first pair of electrodes disposed in contact with one of the spaced apart regions, the one of the spaced apart regions exhibiting resistive characteristics between the first pair of electrodes, one of the first pair of electrodes functioning for supplying a voltage varying according to analogue information to be stored in the device.

6. A device as set forth in claim 5 wherein the gate comprises a resistive layer; and including a second pair of electrodes, one of the second pair of electrodes contacting one end of the gate and the other electrode contacting the opposite end of the gate, both ends of the gate being above the two spaced apart regions.

7. A device as set forth in claim 5 wherein the gate comprises a resistive layer; and including a second pair of electrodes, one of the second pair of electrodes contacting one end of the gate and the other electrode contacting the opposite end of the gate, both ends of the gate being adjacent to the two spaced apart regions.

8. The device as set forth in claim 5, wherein:
   the insulating layer is double-laminated and the charge storing means is disposed at the interface between the two laminae.

9. The device as set forth in claim 5, wherein:
   the charge storing means is disposed in the insulating layer above a portion of the channel forming region which is nonadjacent either of the two spaced apart regions.

10. A nonvolatile semiconductor memory device comprising:
    the semiconductor substrate of a first conductivity type;
    first and second spaced apart regions in the substrate and of opposite conductivity type to the substrate, the regions defining a channel-forming region in the substrate;
    an insulating layer disposed on the substrate above the channel-forming region and adjacent parts of the spaced apart region;
    a floating gate disposed in the insulating layer above the channel-forming region and the adjacent parts of the spaced apart regions, the floating gate comprising at least two low resistance regions and a high resistance region between the two low resistance regions, the low resistance regions being capacitively coupled to the two spaced apart regions;
    whereby voltage variations in the two spaced apart regions are coupled to the respective low resistance regions, establishing a potntial gradient across the high resistance region of the floating gate and producing linear resistance characteristics between the two spaced apart regions.

11. The device as set forth in claim 10, wherein the floating gate has portions extending beyond the channel-forming region and coated with an insulating material; and including third and fourth spaced apart regions in the semiconductive substrate, the third and fourth regions being spaced apart from the first and second spaced apart regions, and disposed partly under the extended portions; first means coupled to the third region for supplying a voltage large enough to induce electrical breakdown of the third region; and second means coupled to the fourth region for supplying a compensating voltage variation opposite in direction to that of the first means.

12. The device as set forth in claim 10 including:
an injection region disposed in the semiconductor substrate and of opposite conductivity type to the substrate for injection of minority carriers, the injection region forming a P-N junction with the semiconductor substrate at a distance from the floating gate of several times the diffusion length of the minority carriers in the substrate; and
means for forward biasing the P-N junction to erase stored information.

13. The device as set forth in claim 10, wherein:
the floating gate has a structure allowing photons to pass therethrough to the channel-forming region.

14. A nonvolatile semiconductor memory device with analogue information storage capability, comprising:
a semiconductor substrate of a first conductivity type;
first, second and third spaced apart regions in the substrate and of opposite conductivity type to the substrate, the first and second regions defining a first channel-forming region in the substrate, the third spaced apart region and the first channel-forming region defining a second channel-forming region in the substrate;
an insulating layer disposed on the substrate at least above the first and second channel-forming regions;
charge-storing means disposed in the insulating layer above the second channel-forming region;
a first gate disposed on the insulating layer and above the first channel-forming region;
a second gate disposed on the insulating layer above the second channel-forming region;
the second gate being electrically isolated from the first gate;
the second gate comprising a resistive layer; and including two electrodes contacting the resistive layer, one of the electrodes functioning to supply a voltage varying according to analogue information to be stored in the device.

* * * * *